United States Patent [19]
Matsui et al.

[11] Patent Number: 5,442,183
[45] Date of Patent: Aug. 15, 1995

[54] CHARGED PARTICLE BEAM APPARATUS INCLUDING MEANS FOR MAINTAINING A VACUUM SEAL

[75] Inventors: Hironobu Matsui, An Yang City, Rep. of Korea; Mikio Ichihashi, Kodaira, Japan; Shinjiroo Ueda, Abiko, Japan; Tadashi Otaka, Katsuta, Japan; Kazue Takahashi, Tsuchiura, Japan; Toshiaki Kobari, Chiyoda, Japan; Kenji Odaka, Tomobe, Japan

[73] Assignee: Hitachi, Ltd., Tokyo, Japan

[21] Appl. No.: 137,965

[22] Filed: Oct. 19, 1993

Related U.S. Application Data

[63] Continuation of Ser. No. 717,018, Jun. 18, 1991, Pat. No. 5,254,856.

[30] Foreign Application Priority Data

| Jun. 20, 1990 | [JP] | Japan | 2-159663 |
| Jun. 20, 1990 | [JP] | Japan | 2-159664 |
| Jul. 4, 1990 | [JP] | Japan | 2-175214 |
| Aug. 13, 1990 | [JP] | Japan | 2-211579 |

[51] Int. Cl.⁶ ............................................. H01J 37/257
[52] U.S. Cl. ............................. 250/441.11; 250/396 R
[58] Field of Search .................... 250/396 R, 397, 398, 250/441.11, 309, 310, 311, 492.3

[56] References Cited

U.S. PATENT DOCUMENTS

| 3,809,899 | 5/1974 | Baker et al. | 250/311 |
| 4,020,353 | 4/1977 | Saito et al. | 250/441.11 |
| 4,397,611 | 8/1983 | Wiesner et al. | 417/49 |
| 4,607,167 | 8/1986 | Petric | 250/441.11 |
| 4,629,898 | 12/1986 | Orloff et al. | 250/396 R |
| 4,680,474 | 7/1987 | Turner et al. | 250/492.2 |
| 4,710,632 | 12/1987 | Ishitani et al. | 250/396 R |
| 5,065,029 | 11/1991 | Kriuanek | 250/441.11 |
| 5,187,371 | 2/1993 | Matsui et al. | 250/396 R |
| 5,254,856 | 10/1993 | Matsui et al. | 250/310 |
| 5,324,950 | 6/1994 | Otaka et al. | 250/441.11 |

FOREIGN PATENT DOCUMENTS

| 55-83143 | 6/1980 | Japan | 250/441.11 |
| 1209646 | 8/1989 | Japan | 250/441.11 |

*Primary Examiner*—Jack I. Berman
*Assistant Examiner*—James Beyer
*Attorney, Agent, or Firm*—Fay, Sharpe, Beall, Fagan, Minnich & McKee

[57] ABSTRACT

A charged particle beam apparatus includes a charged particle beam generating system for causing a charged particle source to generate a charged particle beam. A focusing system focuses the charged particle beam onto a sample. A deflecting system causes the focused charged particle beam to scan the surface of the sample. An evacuating system evacuates a space through which the charged particle beam passes. A detector detects information obtained by irradiating the charged particle beam onto the sample. An image display system displays as an image the status of distribution of the information over the sample surface based on a detection signal forwarded from the detector. The focusing system is entirely constituted by an electrostatic lens containing a plurality of lens electrodes, one of the lens electrodes being a final electrode located closest to the sample. All of the lens electrodes except for the final electrode are supplied with positive voltages as opposed to a negative voltage to the final electrode when the charged particle beam is negatively charged (e.g., electron beam). All of the lens electrodes except for the final electrode are supplied with negative voltages as opposed to a positive voltage to the final electrode when the charged electron beam is positively charged (e.g., positive ion beam). The deflecting system is so constructed as to deflect the charged particle beam within the inner space of the plurality of lens electrodes excluding the final electrode.

9 Claims, 11 Drawing Sheets

CHARGED PARTICLE BEAM APPARATUS INCLUDING MEANS FOR MAINTAINING A VACUUM SEAL

This is a continuation of application Ser. No. 07/717,018, filed Jun. 18, 1991, which is now U.S. Pat. No. 5,254,856, issued Oct. 19, 1993.

BACKGROUND OF THE INVENTION

The present invention relates to improvements in the electron microscope, electron beam lithography apparatus, ion microscope, secondary ion mass spectrometer or other charged particle beam apparatus employing a finely focused charged particle beam (electron or ion beam). Still more particularly, the invention relates to structural improvements in a charged particle beam apparatus that uses an electrostatic lens for finely focusing the charged particle beam.

Conventionally, the above-mentioned charged particle beam apparatus utilizes a magnetic lens to finely focus the charged particle beam onto a sample for observation or processing. Because it contains an exciting coil, the magnetic lens is difficult to reduce in size. Thus there is a limit to downsizing the charged particle beam apparatus using the magnetic lens.

There have been attempts to reduce the entire size of the charged particle beam apparatus using an electrostatic lens for focusing. In such cases, the electrostatic lens is typically an Einzel lens 23 shown in FIGS. 6(A) and 6(B). This Einzel lens comprises three vertically stacked electrodes. The upper and lower electrodes are generally connected to ground potential, while the middle electrode is supplied with a negative (or positive) lens voltage $V_{L1}$. This generates the necessary lens action. In the charged particle beam apparatus utilizing the Einzel lens 23, a deflector 9 is located within a ground potential space above the lens (i.e., on the side of a charged particle source 1) or below it (on the side of a sample 8). (This aspect of the charged particle beam apparatus is illustratively disclosed in Japanese Patent Publication No. 63-67743.)

With a charged particle beam apparatus that finely focuses a charged particle beam onto a sample, the spatial resolution of the apparatus is determined by the diameter of a charged particle beam spot on the sample surface. To obtain the smallest possible spot requires minimizing the optical aberration of a charged particle beam optical system for focusing which is used in the charged particle beam apparatus. If the charged particle beam optical system were constituted by an electrostatic lens arrangement alone, the size of the apparatus would be reduced as a whole. However, the conventional Einzel lens that has been used as the electrostatic objective lens cannot sufficiently raise the spatial resolution because its optical aberration is higher that of the magnetic objective lens. For this reason, using the Einzel lens as the objective lens cannot downsize the entire apparatus without degrading the performance thereof.

In a charged particle beam apparatus that finely focuses a charged particle beam onto the sample surface for observation or processing, a field emission type charged particle source is used to enhance the resolution of such observation or processing.

With the above-mentioned field emission type charged particle source, performing stable field emission of the charged particle beam requires keeping the internal space of the source in the highest possible vacuum state. Thus the charged particle beam apparatus employing the field emission type charged particle source uses two separate vacuum pumps. One pump evacuates a sample chamber in the apparatus, and the other pump evacuates the charged particle source. The dual pump structure makes it possible to evacuate the sample chamber and the charged particle source at different levels of negative pressure. At least when the field emission type charged particle source is emitting a charged particle beam, the source is directly evacuated to a high degree of vacuum by its high vacuum pump independent of the vacuum pump for the sample chamber. This keeps the charged particle source in a high vacuum state regardless of the degree of vacuum in the sample chamber.

Where the charged particle source is evacuated from the atmospheric pressure state it is in or is baked to be gassed, the source is evacuated to a low degree of vacuum. In this case, the high vacuum pump mentioned above is not appropriate for low vacuum evacuation; it must be taken over by yet another pump, i.e., a low vacuum pump that operates for relatively low degrees of vacuum.

Switching between the low and high vacuum pumps for proper evacuation of the charged particle source is generally accomplished using a vacuum pump switching valve and its associated piping. These parts are usually located alongside a beam column containing the charged particle source and the charged particle beam optical system. When the charged particle source is to be evacuated from a low-vacuum state or subjected to degassing, the low vacuum pump is first connected to the source. The low vacuum pump then proceeds to evacuate the charged particle source to a low degree of vacuum. When the charged particle source has attained a certain degree of vacuum or has completed degassing through operation of the low vacuum pump, the switching valve is operated to select the high vacuum pump. The high vacuum pump then starts evacuating the charge particle source to a high degree of vacuum. (In this case, a negative pressure differential exists between the charged particle source and the sample chamber). This type of differential evacuation system is illustratively described in Journal of Electron Microscopy, Vol. 22, No. 2 (1973), pp. 141–147.

On the other hand, it is known that the beam column in the charged particle beam apparatus can be made very small and lightweight if the internal optical system for focusing the beam contains an electrostatic lens arrangement alone. With such a charged particle beam apparatus containing a small and lightweight beam column, it is not desirable to install a vacuum pump switching valve or its associated piping alongside the beam column. Since the switching value and its pipes are difficult to downsize, they are often dimensionally incompatible with the small-sized beam column, and hence with the smaller charged particle beam apparatus that comprises the column. Even if the vacuum pump switching valve and its related piping were somehow made smaller with considerable difficulty, the evacuation conductance of the pumping system for evacuating the charged particle source would be drastically lowered.

SUMMARY OF THE INVENTION

It is therefore an object of the present invention to provide a charged particle beam apparatus comprising a beam column and a sample chamber, the beam column further containing a charged particle source and a charged particle beam focusing optical system for focusing a charged particle beam supplied by the source, wherein the beam column is made small and lightweight so that the apparatus as a whole becomes small and lightweight.

It is another object of the invention to provide a charged particle beam apparatus comprising a beam column constituted by a charged particle source and a charged particle beam focusing optical system, wherein the beam column has a simple and easy-to-operate system for switching between high vacuum and low vacuum evacuation inside.

It is a further object of the invention to provide a charged particle beam apparatus comprising a downsized beam column, wherein an improved vacuum pump system directly evacuates the interior of the column to a high degree of vacuum.

In achieving the foregoing and other objects of the invention and according to one aspect thereof, there is provided a charged particle beam apparatus comprising a beam column and a sample chamber, the beam column containing a charged particle source and a charged particle beam focusing optical system, the sample chamber containing a sample, wherein the charged particle beam focusing optical system is constituted by an electrostatic lens arrangement alone. The electrostatic objective lens for ultimately focusing the charged particle beam onto the sample is made of a plurality (at least three) of lens electrodes. All multiple lens electrodes except for the final electrode closest to the sample are supplied with a positive voltage each when the charged particle beam is negatively charged as opposed to the final electrode, and are fed each with a negative voltage when the charged particle beam is positively charged as opposed to the final electrode. The charged particle beam is deflected within the inner space of those electrodes except for the final electrode. A first lens electrode located immediately above the final electrode (i.e., on the charged particle source side) should preferably be supplied with the final electrode with a voltage which is at least three times as high as the final acceleration voltage of the charged particles. The above construction makes the beam column small and lightweight, which in turn downsizes and lightens the charged particle beam apparatus as a whole.

According to another aspect of the invention, there is provided a charged particle beam apparatus comprising a beam column and a sample chamber, the beam column containing a charged particle beam source, wherein the beam column is moved relative to the sample chamber in such a manner that the evacuation conductance between the beam column and the sample chamber is varied. This construction eliminates the conventional need to install a valve and its piping for switching the vacuum pump system between low vacuum and high vacuum evacuation within the beam column. With the valve and its associated piping removed, the charged particle beam apparatus is reduced drastically in size.

According to a further aspect of the invention, there is provided a charged particle beam apparatus having a high vacuum pump integrally attached to a beam column containing a charged particle beam source, wherein the high vacuum pump evacuates the beam column to a high degree of vacuum. This construction downsizes the high vacuum pump for beam column evacuation, and eliminates the conventional need to install a switching valve and the piping therefor for connecting a separate vacuum pump to the beam column, the valve and the piping being intended for switching between low vacuum and high vacuum evacuation of the beam column. Thus the charged particle beam apparatus is significantly downsized as a whole.

The above and other related objects and features of the invention, as well as the novelty thereof, will clearly appear from the following description and from the accompanying drawings.

DESCRIPTION OF PREFERRED EMBODIMENTS

Preferred embodiments of the present invention will now be described in detail with reference to the accompanying drawings.

Figure 1:
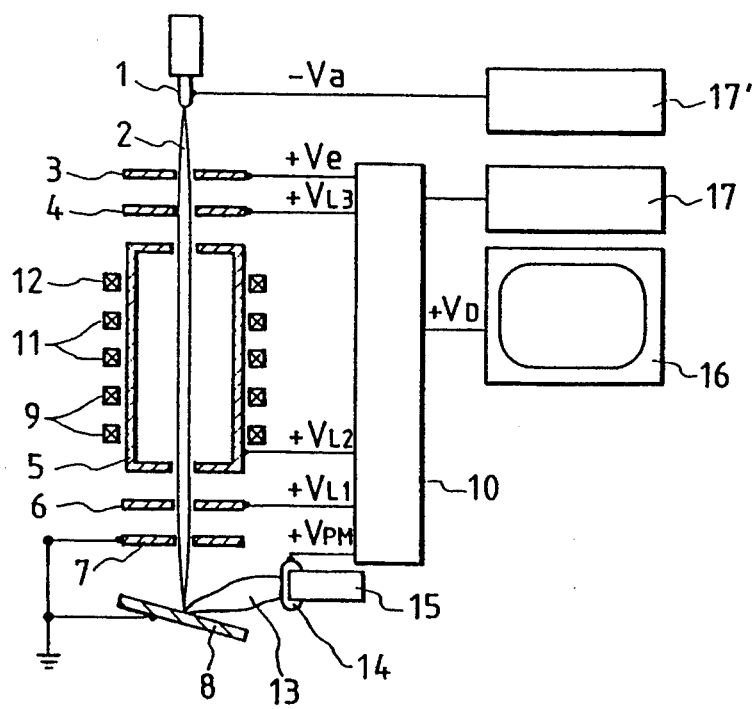
FIG. 1 is a schematic longitudinal section depicting the basic construction of a scanning type electron microscope practiced as a first embodiment of the present invention.

FIG. 1 depicts the first embodiment of the invention as it is applied to a scanning type electron microscope. In FIG. 1, an extraction field formed between a field emission type electron source 1 and an extraction electrode 3 causes the electron source 1 to emit an electron beam 2. The electron beam 2 is focused by an electric field formed across the extraction electrode 3, a third lens electrode 4, a second lens electrode 5, a first lens electrode 6 and a final electrode 7; these electrodes constitute an electrostatic lens. After being finely focused in this manner, the electron beam 2 is irradiated at a sample 8. At the same time, the electron beam 2 is deflected by a deflector 9 within the inner space of the second lens electrode 5 so as to scan the sample 8 two-dimensionally. For optical alignment of the electron beam 2 with the electrostatic lens, an alignment coil 11 is used to shift the beam 2. A stigma coil 12 is provided for astigmatism correction of the electron beam 2. Secondary electrons 13 generated from the sample 8 upon irradiation of the beam 2 thereto are extracted and accelerated by an electric field formed by a high voltage $V_{PM}$ applied to a secondary electron acceleration electrode 14. The secondary electrons 13 then reach a secondary electron detector 15 where they are detected. A detection signal from the detector 15 is used as an intensity modulation signal for a CRT display apparatus 16 that is scanned is synchronization with the electron beam 2. Using the intensity modulation signal, the CRT display apparatus 16 provides a two-dimensional secondary electron image of the surface of the sample 8.

The first embodiment is designed primarily for observation at low acceleration voltages so that the surface of such delicate samples as semiconductors may be minimally charged or damaged by irradiation of an electron beam thereto. Thus the acceleration voltage Va for the electron beam 2 is set for 3 kV or lower (mainly 1 kV or thereabout). This voltage setting is lower than an electron beam extraction voltage from the electron source 1 (this is the voltage between electron source 1 and the extraction electrode 3, i.e., Va+Ve; the setting is usually between 3 and 6 kV). In this setup, supplying the extraction electrode 3 with a positive voltage Ve as opposed to ground potential causes the electron source 1 to trigger field emission.

The chromatic aberration of the electron optical system is minimized as follows: The multiple electrodes (4, 5 and 6) constituting the electrostatic lens except for the final electrode 7 are supplied with a positive voltage as opposed to the latter, i.e., as opposed to ground potential.

Figure 3:
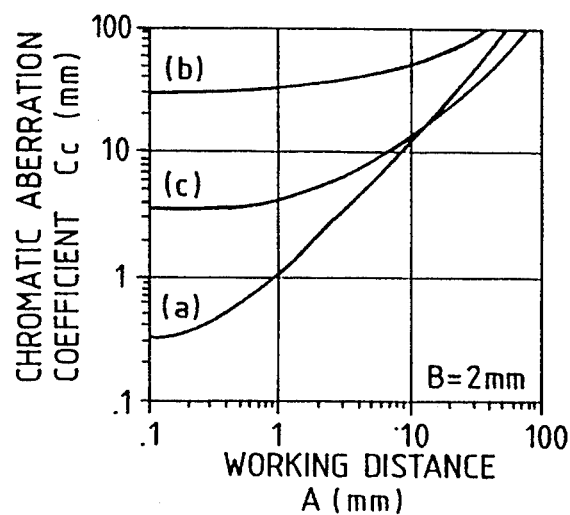
FIG. 3 is a view of characteristic curves illustrating the relationship between working distance and chromatic aberration coefficient regarding an electrostatic lens.

FIG. 3 compares chromatic aberration coefficients with respect to parallel electron beams incident on the lens formed by the first lens electrode 6 and the final electrode 7. In the target low acceleration voltage region, the spot diameter of the electron beam 2 focused onto the sample 8 is determined predominantly by the chromatic aberration. In FIG. 3, a curve (a) represents a case in which the electron beam 2 is focused by applying a positive voltage to the first lens electrode 6, and a curve (b) denotes a case where the electron beam 2 is focused by applying a negative voltage to the first lens electrode 6. Along the horizontal axis of FIG. 3 is taken the working distance A between the lower plane of the lens and the sample surface. In this figure, the distance B between the first lens electrode 6 and the final electrode 7 is 2 mm. A curve (c) in FIG. 3 illustrates the chromatic aberration coefficient of a typical magnetic lens (lens gap=4 mm; lens aperture diameter=3 mm).

Comparing the curves (a) and (b) reveals that the electrostatic lens produces less chromatic aberration if the first lens electrode 6 is supplied with the positive voltage. That is, when the electron beam 2 is focused by applying the negative voltage to the first lens electrode 6 (as shown by curve (b)), the resulting chromatic aberration coefficient is made several times greater than that of the conventional magnetic lens (as depicted by curve (c)). By contrast, when the electron beam 2 is focused by applying the positive voltage to the first lens electrode 6 (as illustrated by curve (a)), the resulting chromatic aberration coefficient is much lower than that of the magnetic lens in a region where the working distance A is 10 mm or shorter. Even if the working distance A exceeds 10 mm, the chromatic aberration coefficient is substantially the same as that of the conventional magnetic lens (as denoted by curve (c)) up to a working distance of 20 mm.

Figure 4:
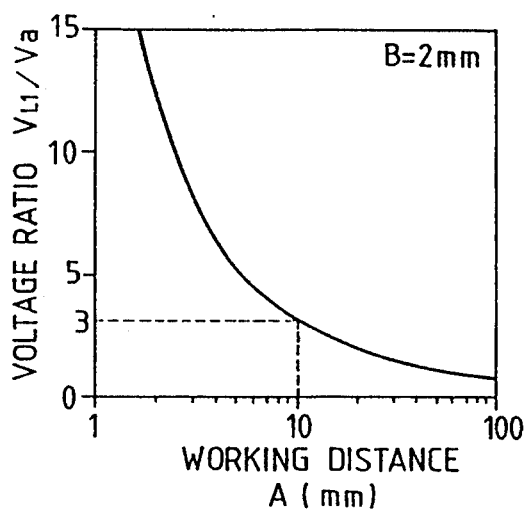
FIG. 4 is a view of characteristic curves showing the relationship between the working distance and the necessary inter-electrode voltage ratio regarding the electrostatic lens.

FIG. 4 illustrates a voltage ratio ($V_{L1}$/Va), i.e., the necessary voltage $V_{L1}$ applied to the first lens electrode 6 with respect to the working distance A, in comparison with the acceleration voltage Va. It is known from FIG. 4 that the condition for attaining a chromatic aberration coefficient smaller than that of the magnetic lens (A<10 mm in this example) is $$V_{L1}/Va \geq 3$$

It has been confirmed experimentally that the condition changes very little even if the electrode-to-electrode distance B is varied within a wide range of 1 mm to 10 mm.

Figure 5A:
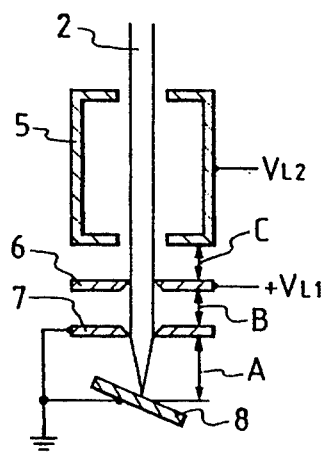
FIG. 5(A) is a schematic longitudinal section of the electrostatic lens, depicting how voltages are supplied to the component electrodes thereof.
Figure 5B:
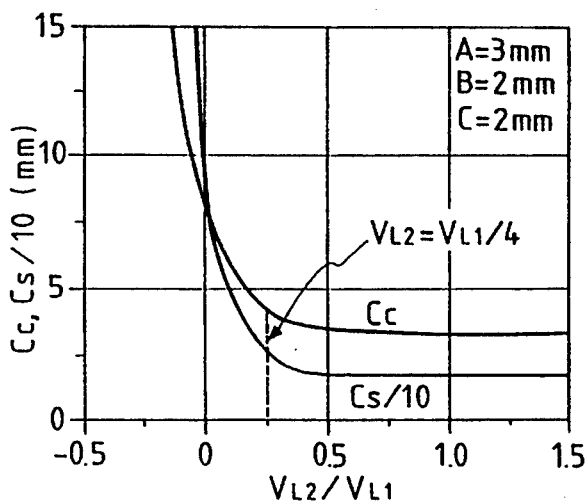
FIG. 5(B) is a view of characteristic curves showing the relationship between the ratio of voltages applied to each electrode and the aberration coefficient regarding the electrostatic lens.

FIG. 5(B) shows the result of computations on a chromatic aberration coefficient Cc and a spherical aberration coefficient Cs in effect when the electron beam 2 is focused using the electrostatic lens comprising the electrodes 5, 6 and 7 of FIG. 5(A). In this example, the working distance A is set for 3 mm, and the electrode-to-electrode distances B and C are set for 2 mm each. The final electrode 7 is connected to ground potential. The electron beam 2 is focused by supplying a positive voltage $+V_{L1}$ to the first lens electrode 6 and a voltage $V_{L2}$ to the second lens electrode 5. The horizontal axis of FIG. 5 (B) denotes a ratio ($V_{L2}/V_{L1}$), i.e., the ratio of the $V_{L2}$ supplied to the second electrode lens 5, with respect to the voltage $V_{L1}$ supplied to the first lens electrode 6.

As is known from FIG. 5 (B), the chromatic aberration coefficient in a region of $$V_{L2}/V_{L1} < 0$$

i.e., in a region in which the negative potential is applied to the second lens electrode 5, becomes significantly greater than the chromatic aberration coefficient in a region of $$V_{L2}/V_{L1} > 0$$

i.e., in a region where the second lens electrode 5 is supplied with the positive potential.

Figure 6A:
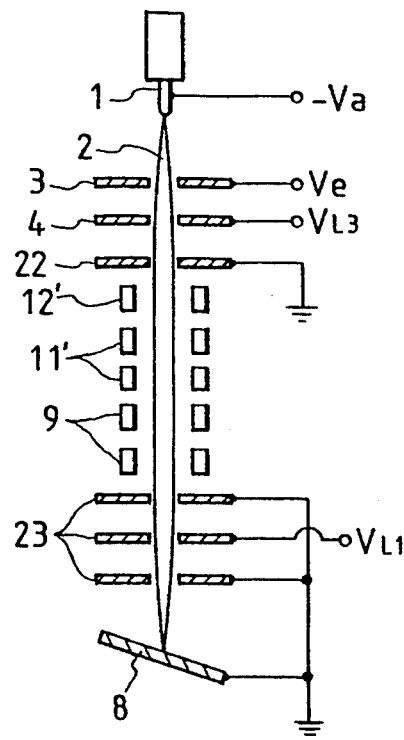
FIGS. 6(A) and 6(B) are schematic longitudinal sections of typical prior art electron optical systems using an Einzel lens.
Figure 6B:
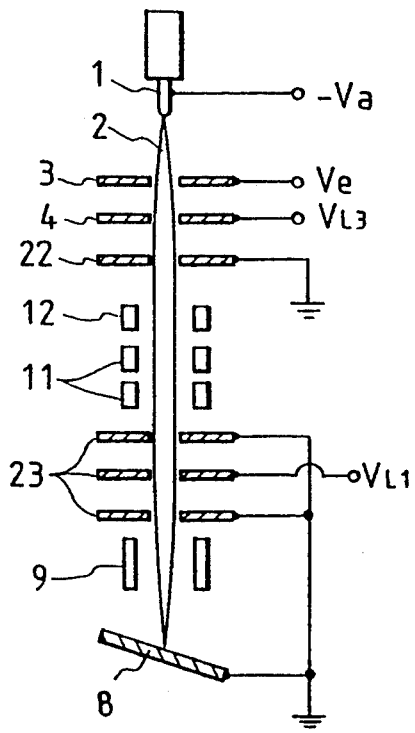

FIGS. 6 (A) and 6 (B) depict typical prior art electron beam focusing systems using an Einzel lens 23. Of the three electrodes making up the Einzel lens, the upper and lower electrodes are connected to ground potential. The electron beam is deflected within a ground potential space outside (above or below) the lens. An electrode 22 located on the electron source side is also connected to ground potential. This setup corresponds to that case of FIG. 5 (B) to which applies $$V_{L2}/V_{L1} = 0 \ (V_{L1} \neq 0)$$

From this, it is known that the supply of the positive voltage to the second lens electrode 5 ensures a chromatic aberration coefficient drastically lower than that of the Einzel lens used in the conventional electron beam focusing optical system comprising the electrostatic lens arrangement. In particular, the chromatic aberration coefficient is now known to be made lower than that of the magnetic lens when the second lens electrode 5 is supplied with a positive voltage $V_{L2}$ equal to or higher than the voltage $V_{L1}$ fed to the first lens electrode 6 ($L_{L2} \geq V_{L1}/4$).

As described, when all multiple electrodes—no matter how many—between the extraction electrode 3 and the final electrode 7 (not inclusive) are each supplied with a positive potential as opposed to the final electrode 7, the resulting chromatic aberration coefficient is made significantly lower than if a certain electrode is fed with a negative potential as opposed to the final electrode 7 or is supplied with the same potential as that of the latter. Therefore, the above-described first embodiment has its third lens electrode 4 supplied with the positive potential $+V_{L3}$.

An example of supplying voltages to the electrodes contained in the first embodiment may involve Ve = +3 kV
$V_{L3}$ = +(0.5 through 3) kV
$V_{L2}$ = +(2 through 6) kV
$V_{L1}$ = +(3 through 7) kV where, the acceleration voltage Va = −1 kV, the working distance A = 5 mm, and the extraction voltage = 4 kV.

With the first embodiment, the electron beam is focused by adjusting the voltages $V_{L3}$, $V_{L2}$ and $V_{L1}$ applied to the respective electrodes while the sample is fixed in the same position. This feature makes it possible to increase the current of the electron beam incident on the sample (called a probe current) at the expense of a slightly enlarged spot diameter of the electron beam on the sample surface. Alternatively, the spot diameter may be reduced by reducing the probe current.

As shown in FIG. 3, to obtain high levels of resolution requires positioning the sample as close to the lens as possible. In the first embodiment, the deflector 9 is located above the final electrode 7 so that the electron beam is subject to the deflective action in the inner space of the second lens electrode 5. This setup allows the sample 8 to be positioned as close to the final electrode 7 as possible. This is another advantage over the prior art setup illustrated in FIG. 6 (B).

In the first embodiment of FIG. 1, the electron optical system is constituted by the electrostatic lens arrangement alone, i.e., without recourse to a magnetic lens. This downsizes the beam column of the electron optical system considerably, the column measuring as small as 34 mm in outer diameter and 150 mm in height. Furthermore, the first embodiment keeps the extraction electrode 3 and the lens electrodes 4, 5 and 6 making up the electrostatic lens to positive potentials as opposed to the final electrode 7. This provides a level of resolution higher than that of the magnetic lens (resolution of 6 nm for an acceleration voltage of 1 kV).

Figure 2:
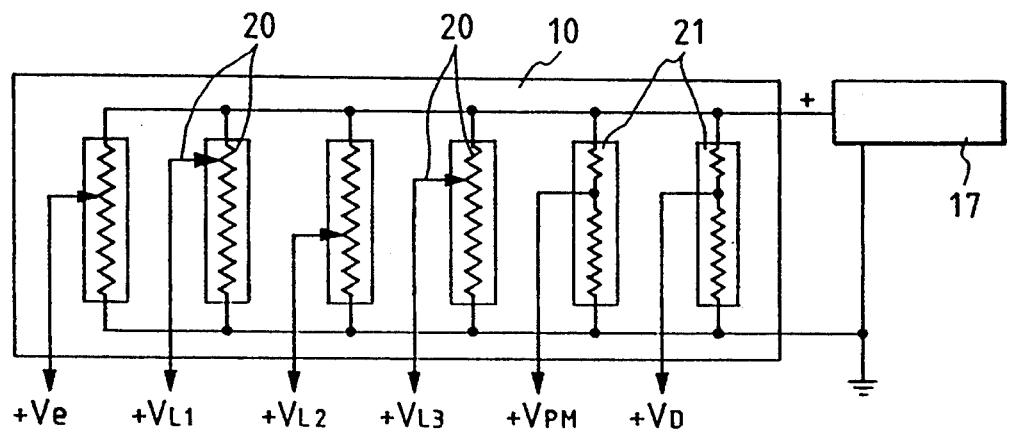
FIG. 2 is a schematic circuit diagram of a voltage divider used in the first embodiment of FIG. 1.

As described, the voltages fed to the electrodes 4, 5 and 6 are all positive, i.e., voltages of the same polarity. In practice, a high voltage output from a common positive high voltage source 17 may be divided by a voltage divider 10 into necessary voltages which in turn are supplied to the respective electrodes. As illustrated in FIG. 2, the voltage to each electrode is supplied through a separate variable resistor 20 so that each voltage may be adjusted independently.

The voltage $V_{PM}$ to the secondary electron acceleration electrode 14 is also a positive voltage, generally ranging from +7 to +10 kV. Another positive voltage used with the first embodiment is a voltage $V_p$ ranging from +10 to +20 kV for supply to the anode terminal of the CRT in the CRT display apparatus 16 for sample image observation. The voltages $V_{PM}$ and $V_D$ to the secondary electron acceleration electrode 14 and to the display apparatus 16 are supplied by the positive high voltage source 17 through the voltage divider 10. Because these two voltages $V_{PM}$ and $V_D$ need not be varied under normal circumstances, the first embodiment utilizes a fixed resistor 21 for voltage division, as shown in FIG. 2. Needless to say, the electron source 1 requires being fed with a negative voltage (acceleration voltage) −Va. This requirement is met by separately installing a negative high voltage source 17'.

Figure 7:
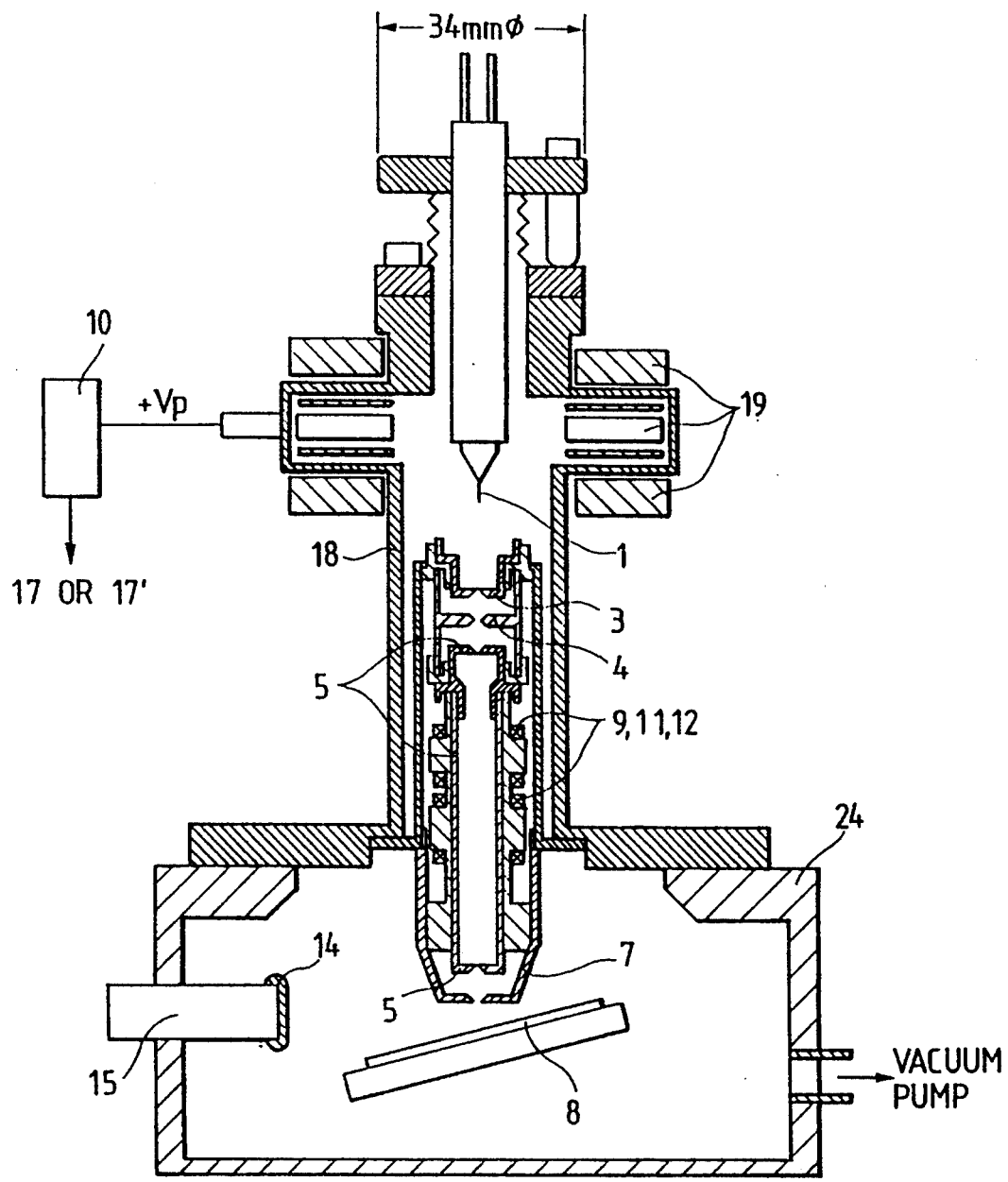
FIG. 7 is a schematic longitudinal section illustrating the basic construction of a scanning type electron microscope practiced as a second embodiment of the invention.

FIG. 7 depicts the second embodiment of the invention. In the electron optical system of the second embodiment, the first lens electrode 6 and the second lens electrode 5 of the first embodiment are connected to each other so that the two electrodes bear the same potential. That is, in terms of potential, the two electrodes constitute a single electrode 5. The objective lens below the deflector 9 is an electrostatic lens made of two electrodes 5 and 7. This setup corresponds to that case of FIG. 5 in which $V_{L2}/V_{L1} = 1$. As depicted in FIG. 5, even when the first lens electrode 6 and the second lens electrode 5 are combined in terms of potential into one electrode (i.e., $V_{L2}/V_{L1}$ fixedly set to 1), the chromatic aberration does not appreciably increase as a result.

If, as in the first embodiment, the sample is fixed in the same position, the electron beam is focused by adjusting the voltages $V_{L3}$ and $V_{L1}$. This setup may raise the probe current to the sample at the expense of a slightly enlarged spot diameter on the sample surface. Alternatively, the spot diameter may be reduced be lowering the probe current.

The fact that in building the second embodiment, one electrode is removed from the construction of the first embodiment, makes the structure of the electron optical system in the second embodiment that much simpler. For example, the scanning type electron microscope practiced as the second embodiment measures 34 mm in the outer diameter of the beam column and 120 mm in height. These dimensions are much smaller than those of the first embodiment of FIG. 1.

The second embodiment utilizes a getter ion pump 19 as the vacuum pump for the beam column 18 thereof. To operate the getter ion pump 19 requires supplying a high voltage (+Vp) of about 5 kV. The voltage Vp may be either positive or negative. In either case, the voltage Vp should preferably be supplied by the positive high voltage source 17 or the negative high voltage source 17' via a suitable voltage divider.

Figures 8A, 8B:
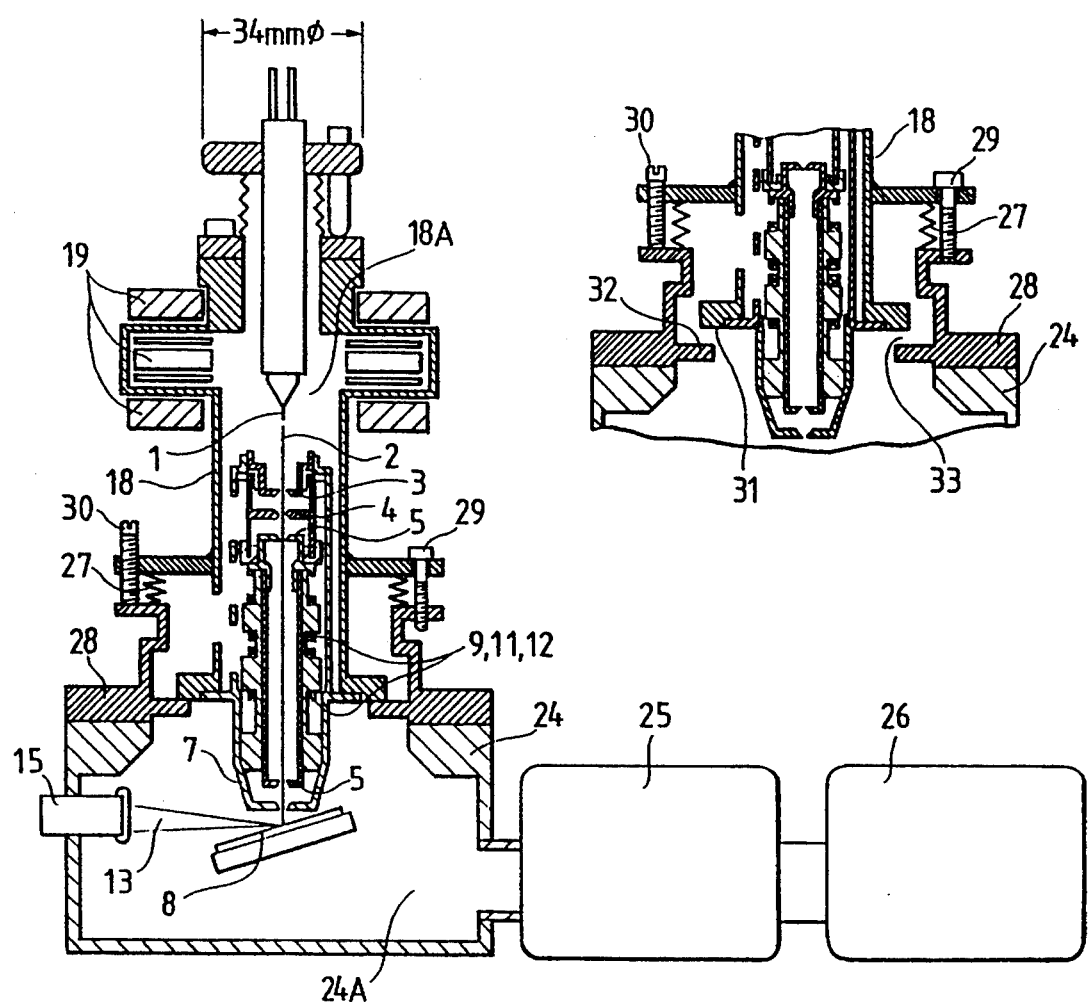
FIGS. 8(A) and 8(B) are a schematic longitudinal section and a partial schematic longitudinal section, respectively, of the basic construction of a scanning type electron microscope practiced as a third embodiment of the invention.

FIGS. 8(A) and 8(B) illustrate the third embodiment of the invention. This embodiment has an improved construction for evacuating to a low degree of vacuum the beam column containing a field emission type electron source.

In FIG. 8(A), the extraction field formed between the field emission type electron source 1 and the extraction electrode 3 causes the electron source 1 to emit the electron beam 2. Part of the emitted electron beam is extracted through a central aperture opening of the extraction electrode 3. The extracted electron beam 2 is subject to the focusing action by the electric field formed across the extraction electrode 3 as well as the lens electrodes 4, 5 and 7, the latter three constituting a focusing lens system. The electron beam 2 is finely focused in this manner onto the sample 8. In the third embodiment, the second lens electrode 5 is kept to a positive potential as opposed to the ground potential of the final electrode 7, so that the optical aberration of the focusing lens system is minimized. The electron beam 2 focused on the sample 8 is deflected by the deflecting coil 9 inside the inner space of the second lens electrode 5 so as to scan the sample surface two-dimensionally. For optical alignment of the electron beam 2, the alignment coil 11 is used to shift the optical axis of the beam 2 as needed. The stigma coil 12 is provided for astigmatism correction of the electron beam 2. The coils 9, 11 and 12 are wound on a common bobbin in an overlapping manner.

Secondary electrons 13 generated from the sample 8 upon irradiation of the electron beam 2 thereto are detected by the secondary electron detector 15. A detection signal from the detector 15 is fed as an image signal to a CRT display apparatus, not shown. Using the supplied image signal, the CRT display apparatus provides a two-dimensional secondary electron image of the surface of the sample 8.

As described, the electron source 1 is a field emission type electron source. Thus to obtain a stable flow of field emission electrons from the electron source 1 requires providing a vacuum as high as $10^{-10}$ Torr near the source 1. To meet this requirement, the third embodiment utilizes the getter ion pump 19 as the high vacuum pump for evacuating the inner space 18A of the beam column 18 containing the electron source 1. The inner space 24A of a sample chamber 24 is evacuated by a low vacuum turbo-molecular pump 25 and a rotary pump 26. The beam column 18 is attached to a flange 28 with a bellows 27 in between, the column containing the electron source 1, the extraction electrode 3, the focusing lens system made of the lens electrodes 4, 5 and 7, and the getter ion pump 19. In turn, the flange 28 is mounted hermetically on the upper wall of the sample chamber 24.

Samples are changed frequently in the sample chamber. Thus the degree of vacuum inside the sample chamber 24 can be maintained at most to $10^{-6}$ Torr even though such means as a sample preparation chamber are provided to keep the chamber vacuum as high as possible. To keep a high vacuum state near the electron source 1 while the sample chamber 24 is left somewhat low in the degree of vacuum, the high vacuum pump 19 inside the beam column 18 evacuates the inner space 18A of the electron source 1. In this case, the inner space 18A is at a level of negative pressure different from that of the inner space 24A of the sample chamber 24. In practice, push screws 30 are loosened and pull screws 29 tightened so as to press the lower surface 31 of the beam column against the upper surface of the flange 28. This spatially disconnects the sample chamber inner space 24A from the electron source inner space 18A with the exception of that central aperture opening of the finale electrode 7 through which the electron beam 2 passes. (This is the state in which the evacuation conductance between the electron source and the sample chamber is the lowest.) In that state, the electron source and the sample chamber are separately evacuated by independent pumps (electron source by getter ion pump 19, sample chamber by turbo-molecular pump 25). This makes it possible to keep the inner space 18A of the electron source 1 in a very high vacuum state even though the sample chamber 24A has an inner space of a lower degree of vacuum. The setup above allows the electron source 1 to trigger stable field emission.

When the electron source 1 is to be evacuated from the atmospheric pressure, the getter ion pump 19 for high degree evacuation cannot be used from the start. This is because the getter ion pump 19 operates only at degrees of vacuum higher than $10^{-5}$ Torr. Where the beam column 18 is subjected to degassing following a baking process, the column 18 should not be evacuated by the getter ion pump 19 because the degree of vacuum in the electron source 1 drops considerably as a result of the degassing. If the getter ion pump 19 is forced to operate from a degree of vacuum lower than $10^{-5}$ Torr, the service life of the pump 19 will suffer drastically. Under these circumstances, a separate low vacuum pump should be used to evacuate the electron source 1 when the latter is in a low vacuum state. It is then necessary selectively to operate the low vacuum pump or the high vacuum pump such as a getter ion pump depending on the electron source 1 getting evacuated from a low or high vacuum state.

Figure 9:
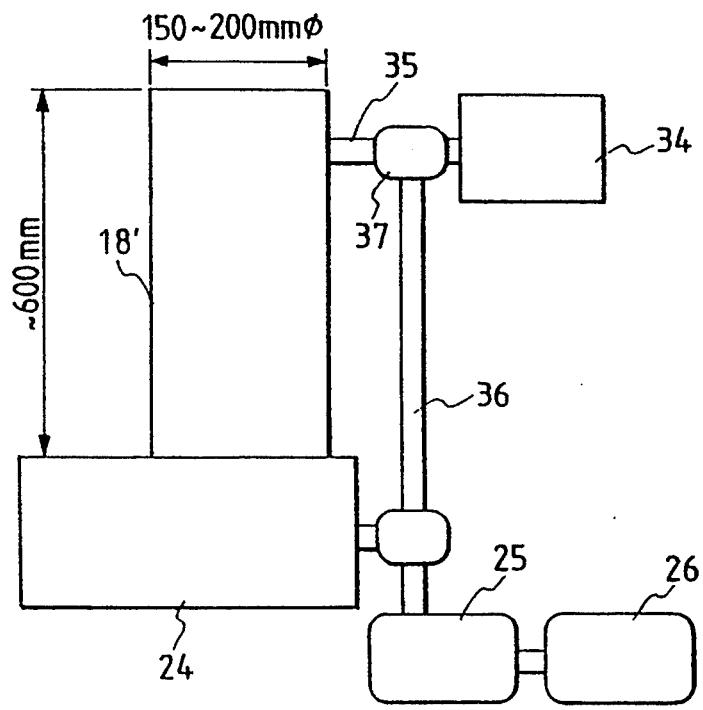
FIG. 9 is a schematic view of a typical valve arrangement and its related piping for switching an evacuation system in a prior art scanning type electron microscope.

In a conventional setup, as shown in FIG. 9, the vacuum pumps are switched using pipes 35 and 36 as well as a switching valve 37 located alongside a beam column 18'. In operation, when the beam column 18' is to be evacuated by a high vacuum pump 34 (separate from the sample chamber 24), the valve 37 disconnects the low vacuum pumps 25 and 26 from the beam column 18', and connects instead the high vacuum pump 34 to the column 18'. Conversely, when the beam column 18' is to be evacuated from a low degree of vacuum, the valve 37 disconnects the high vacuum pump 34 from the beam column 18', and directly connects the low vacuum pumps 25 and 26 to the column 18'.

The prior art beam column 18' in a conventional scanning type electron microscope utilizing the magnetic objective lens is bulky. That is, the typical prior art beam column 18' measures as much as 150 to 200 mm in outer diameter and 600 mm in height. The accompanying high vacuum pump 34 becomes correspondingly large. Given such bulky components, the entire beam column does not appear particularly large when equipped with the pipes 35 and 36 as well as the valve 37.

However, as depicted in FIG. 8 (A), constructing the focusing lens system with an electrostatic lens arrangement alone—without the use of a magnetic lens—provides a beam column as small as 34 mm in outer diameter and about 120 mm in height. For such a downsized beam column, the pump to evacuate the interior thereof may be correspondingly small in capacity. Thus the small-sized getter ion pump 19 may be incorporated in the beam column 18. This reduces in size the entire construction of the beam column 18 including the getter ion pump 19 for the evacuation thereof. In turn, the downsized beam column can make the structure of the scanning type electron microscope drastically smaller than ever.

Figure 10:
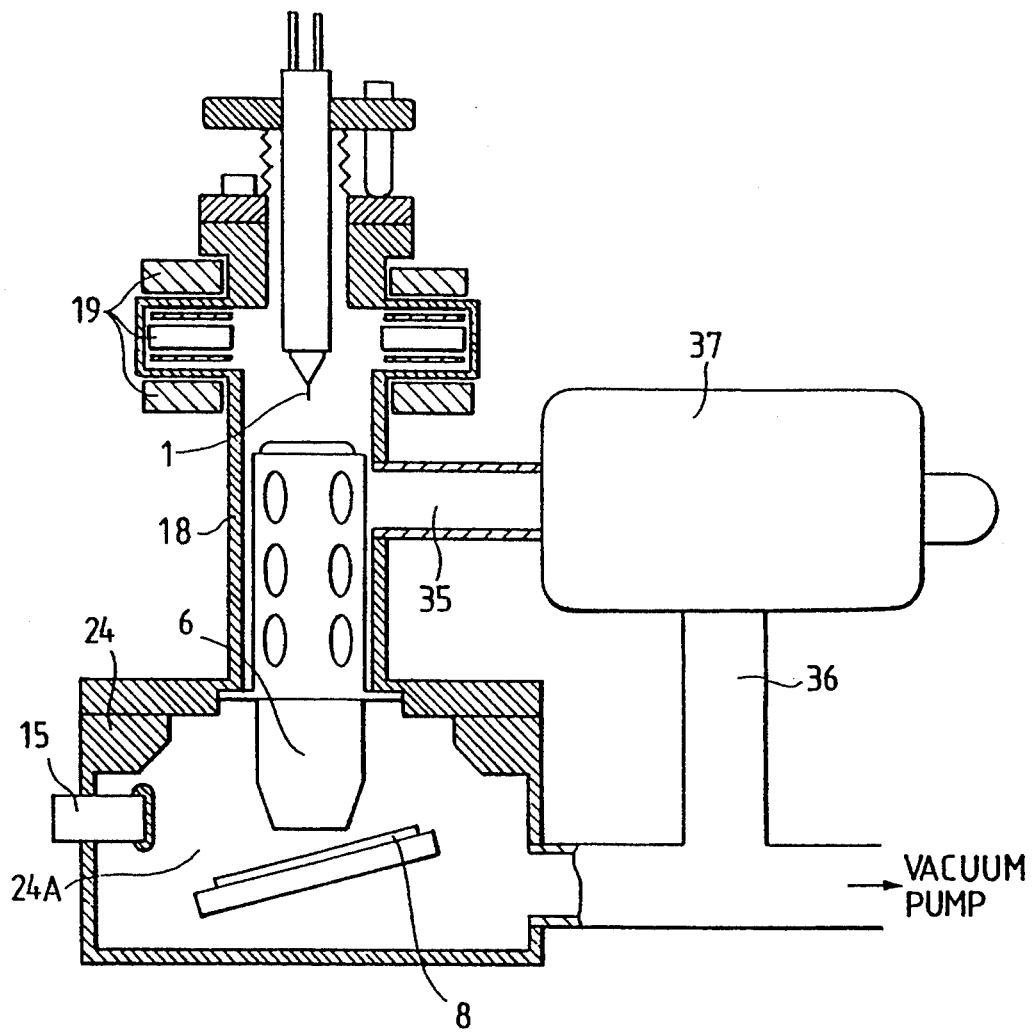
FIG. 10 is a schematic longitudinal section of a scanning type electron microscope with its beam column downsized according to the invention, the microscope being combined with the prior art piping and valve arrangement for evacuation switching.

However, if the small-sized beam column 18 is equipped with the conventional pipes 35, 36 and valve 37 for low degree evacuation, as shown in FIG. 10, the section made of the piping and the valve becomes so large that the dimensional advantages gained from downsizing the beam column 18 are all but lost. As a result, the beam column 18 as a whole is still as bulky as ever. If the piping and valve section were forcibly downsized, the evacuation conductance between the beam column 18 and the low vacuum pump would be made that much lower. The reduced evacuation conductance can hamper the execution of sufficient evacuation.

In the third embodiment of FIG. 8 (A), the beam column 18 as mentioned is so small and lightweight that it is easy to move. Thus the beam column 18 of this embodiment is moved up and down to implement the function of a switching valve for the beam column evacuation system. That is, when the beam column 18 is to be evacuated to a high degree of vacuum (independent of the electron source), the push screws 30 are loosened and the pull screws 29 tightened so as to press the beam column lower surface 31 to the upper flange surface 32, as already described. This state is exactly what is shown in FIG. 8 (A). Where it is necessary to start evacuating the beam column 18 using the low vacuum pump from, say, the atmospheric pressure, the pull screws 29 are loosened and the push screws 30 tightened, as illustrated in FIG. 8 (B). This raises the entire beam column 18, creating a gap 33 between the beam column lower surface 31 and the upper flange surface 32. The operation above increases the evacuation conductance between the beam column inner space 18A and the sample chamber inner space 24A. It is through the gap 33 that the beam column 18 is evacuated from a low degree of vacuum using the turbomolecular pump 25 or the rotary pump 26 on the sample chamber side. This construction eliminates the conventional need to install pipes 35 and 36 or a valve 37 as shown in FIGS. 9 and 10, thereby making it possible to downsize the entire beam column significantly.

If the pipes 35 and 36 as well as the valve 37 of FIGS. 9 and 10 are forcibly reduced in size, the evacuation conductance on the side of the electron source 1 is drastically lowered as viewed from the pumps 25 and 26 for the sample chamber. By contrast, in the third embodiment of FIG. 8 (A), the gap 33 is formed throughout the whole outer circumference of the beam column lower surface 31. This construction makes it possible to secure sufficient evacuation conductance for the gap 33. Furthermore, the evacuation conductance is selected as desired by suitably adjusting the gap length between the beam column lower surface 31 and the upper flange surface 32.

Figure 11A:
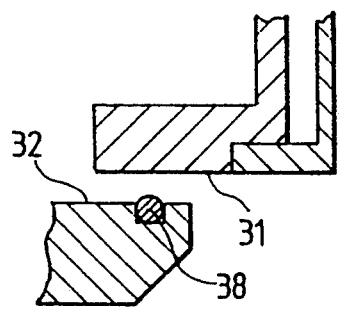
FIGS. 11(A) and 11(B) are partial schematic longitudinal sections of typical vacuum sealing structures installed between the beam column and the sample chamber.
Figure 11B:
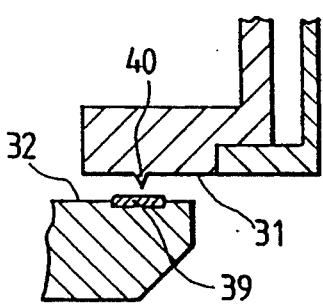

For the third embodiment, the beam column lower surface 31 and the upper flange surface 32 are each machined to a smooth, flat plane so that gas leakage is minimized from between the two surfaces being pushed together. The snugly contacted surfaces help to implement the differential pressure evacuation feature between the electron source 1 and the sample chamber 24. To further eliminate gas leakage between the contact surfaces, an O-ring or other appropriate sealing member 38 may be interposed therebetween, as illustrated in FIG. 11 (A). Alternatively, as depicted in FIG. 11 (B), a sealing member 39 made of a metal such as Au, Ag or Al may be interposed between the contact surfaces, with a circular rib under the beam column lower surface 31 allowed to bite into the sealing member 39.

As described in connection with the third embodiment, evacuation of the electron source 1 to a high degree of vacuum is made easier by hermetically contacting the beam column lower surface 31 with the upper flange surface 32 while the sample chamber is left in a vacuum of a difference level. The contacted surfaces minimize the gas leakage that may occur therebetween. It is to be noted, however, that the electron source 1 is still connected spatially to the sample chamber 24 through the central aperture opening of the final electrode 7. Evacuation of the two components from different degrees of vacuum proceeds while the aperture of the final electrode 7 remains open, allowing a certain level of gas to leak therethrough. It follows that, as far as the capacity of the high vacuum pump 19 for electron source evacuation permits, it is not mandatory completely to eliminate gas leakage between the beam column lower surface 31 and the upper flange surface 32.

In the third embodiment, the beam column containing the charged particle source is made smaller, and the beam column is shifted relative to the sample chamber to vary the evacuation conductance as desired between the beam column and the sample chamber, as described above. This allows a plurality of pumps to be switched for beam column evacuation. The feature drastically downsizes the charged particle beam apparatus as a whole.

Figure 12:
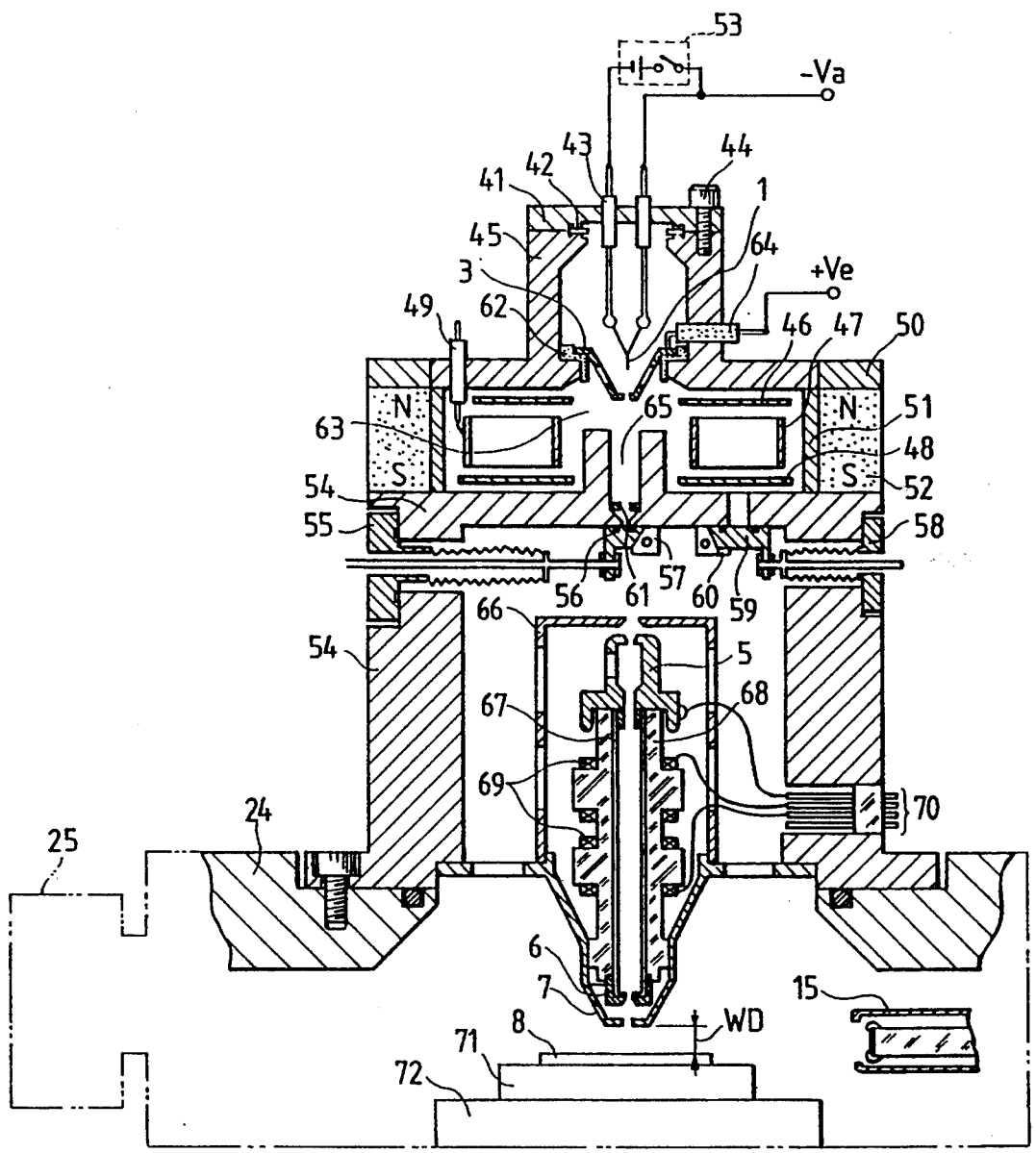
FIG. 12 is a schematic longitudinal section showing the basic construction of a scanning type electron microscope practiced as a fourth embodiment of the invention.

FIG. 12 illustrates the fourth embodiment of the invention. This embodiment comprises structural improvements for keeping the inner space of the field emission type electron source to a very high degree of vacuum.

In FIG. 12, the field emission type electron source contains a field emission tip 1 mounted on a flange 41 with an insulator 43 interposed therebetween. The flange 41 is hermetically screwed with screws 44 to the upper edge of an upper magnetic path member 45, with a metal packing 42 interposed between the flange 41 and the upper edge. The upper magnetic path member 45 is a cylindrical member that also serves as the vacuum wall of an electron source chamber. With the electron source chamber evacuated to a high degree of vacuum, supplying a negative acceleration voltage $-V_a$ to the field emission tip 1 causes the tip to emit an electron beam. A flashing power source 53 flashes the field emission tip 1 so that the latter will restore its field emission capability after expiration thereof.

To obtain a stable flow of field emission electrons requires keeping the vicinity of the tip 1 to a degree of vacuum as high as $10^{-10}$ Torr. Such high degrees of vacuum are obtained with the fourth embodiment using an ion pump located in the space immediately below the electron source chamber. Specifically, an ion pump for very high degrees of evacuation is located in the space formed by positioning a stainless steel cylindrical wall 51 between the lower surface of the upper magnetic path member 45 and the upper surface of a lower magnetic path member 54. The ion pump comprises a plurality of evacuation units each made of upper and lower discs 46, 48 and a cylindrical ring 47, the units being positioned in a rotatably symmetric manner around the beam column axis. Illustratively, the discs 46 and 48 may be made of titanium (Ti) connected to ground potential. The cylindrical ring 47 may illustratively be of stainless steel, supplied via an insulating plug 49 with a positive high voltage (4 to 5 kV). Outside the cylindrical wall 51 is a ring-shaped magnet 52. The magnet 52 may illustratively be a permanent magnet that is magnetized in parallel with the beam column axis.

The inner space of the electron source chamber is evacuated to a very high degree of vacuum on the basis of the known getter ion pump principle as follows: Lines of magnetic force from the magnet 52 form an axially oriented magnetic field within the magnetic gap across a magnetic path plate 50, the upper magnetic path member 45 and the lower magnetic path member 54. That is, within the inner space of the cylindrical ring 47 forming each evacuation unit, lines of magnetic force extend downward in parallel with the cylindrical axis of the ring 47. In such a state, feeding a high positive voltage of 4 to 5 kV to the cylindrical ring 47 causes a Penning discharge inside the ring space. The discharge triggers sputtering on the surface of the titanium discs 46 and 48. Titanium particles stemming from the sputtering stick to the surface of the cylindrical ring 47, forming a pure titanium particle layer on that surface. The pure titanium particle layer initiates the so-called getter action, which absorbs and captures any gas molecules that may remain inside the electron source chamber, evacuating the space within.

The initial evacuation of the inner space of the electron source up to a degree of vacuum where the getter ion pump becomes operational (about $10^{-6}$ Torr) is performed as follows: An air lock valve 59 is first opened spatially to connect the electron source with the sample chamber. The vacuum pump 25 for the sample chamber is then operated for evacuation. The air lock valve 59 is illustratively attached to a flange 58 with a bellows therebetween. The valve 59 is operated from outside the vacuum chamber. The airtightness of the air lock valve 59 in its closed position is enhanced using a guide 60 that pushes the valve 59 upward when the latter is closed. After the inner space of the electron source is initially evacuated to about $10^{-6}$ Torr in degree of vacuum, the air lock valve 59 is closed. Then the electron source is evacuated independently using the above-described ion pump up to a maximum of $10^{-10}$ Torr in degree of vacuum.

To cause the field emission tip 1 to emit an electron beam requires supplying an acceleration voltage $-Va$ to the tip 1 while simultaneously feeding an extraction voltage $+Ve$ via a leading terminal 64 to the extraction electrode 3 insulated by an insulating spacer 62. To obtain a final acceleration voltage of, say, 1 kV for the electron beam, it is necessary to supply $-1$ kV to the tip 1 and $+3$ kV to the extraction electrode 3. This develops an extraction voltage of about 4 kV between the tip 1 and the extraction electrode 3, thus extracting a sufficient beam current from the tip 1. The extracted electron beam is finely focused by the magnetic field formed in a gap 63 (called a magnetic gap) between the upper magnetic path member 45 and the lower magnetic path member 54. The gap 63 serves both as a vent hole for evacuation by the ion pump and as a magnetic gap that generates a focused magnetic field of axial symmetry around the extracted electron beam. The finely focused electron beam is forwarded to the sample chamber 24 through the aperture opening of a fixed aperture plate 61 located inside an electron beam passage opening 65. The aperture opening not only serves to focus and let pass the electron beam, it also acts as a vent hole that helps to keep the inner space of the electron source to as high as $10^{-10}$ Torr in degree of vacuum while the sample chamber is left to a degree of vacuum as low as $10^{-6}$ Torr.

Below the electron beam passage opening 65 is an air lock valve 56 for closing that opening. The air lock valve 56, attached to a flange 55 with a bellows therebetween, is operated from outside the vacuum chamber. The airtightness of the air lock valve 56 in its closed position is enhanced using a guide 57 that tightens the valve 56 when the latter is closed. When the sample chamber is exposed to the atmosphere or at a very low degree of vacuum, the air lock valves 56 and 59 are both closed to disconnect completely the electron source space from the sample chamber space. This keeps the electron source space to a high degree of vacuum regardless of the degree of vacuum in the sample chamber space. On the other hand, when the sample chamber space is evacuated to a degree (about $10^{-6}$ Torr) high enough to keep intact the vacuum state of the electron source space even if both spaces are connected, then the valve 56 is opened and then pulled out of the electron beam's way so that the electron beam may reach the sample chamber.

As described, the aperture opening of the fixed aperture plate 61 is small. The electron beam is focused by the magnetic field formed within the magnetic gap 63 between the upper and lower magnetic path members 45 and 54. In this setup, the intensity of the focusing magnetic field may be determined beforehand so as to position the focal point of the electron beam near the aperture opening. This makes it possible to focus the electron beam efficiently into the aperture opening, the beam being emitted within a desired solid angle upon departure from the tip 1. In this manner, the electron beam is led into the sample chamber as a large current electron beam.

In a high degree vacuum state such as the one described above, the electron beam scattering inside the electron source chamber and irradiated onto the fixed aperture plate 61 can generate gases from the plate 61 and from the inner wall of the chamber. The gases can drop the degree of vacuum and pose a threat to extracting a stable electron beam for an extended period of time. But with the above-described fourth embodiment, the electron beam emitted by the tip 1 within an effective solid angle is focused by the focusing magnetic field into the aperture opening of the fixed aperture plate 61. The electron beam thus focused is led into the sample chamber with high efficiency, while the discharge of gases from the aperture plate and electron source inner wall is reduced. This makes it possible to extract a stable electron beam for a long period of time.

The upper and lower magnetic path members 45, 54 and the flange 41 are illustratively made of such magnetic materials as permalloy and pure iron. These part are positioned in an axially symmetric manner around the electron beam axis (electron optical axis). This arrangement provides a uniform shield of the electron beam around its axis, offering an apparatus construction that is highly resistant to disturbances caused by external magnetic fields. With a compact high vacuum pump incorporated inside the beam column on the electron source side, the beam column structure is drastically downsized.

In the fourth embodiment described above, only the permanent magnet 52 is used to produce the magnetic field for the ion pump to operate. Alternatively, the permanent magnet 52 may be equipped with an auxiliary exciting coil whose exciting current may be adjusted by suitable means. Adjusting the exciting current regulates the intensity of the focusing magnetic field formed within the magnetic gap 63. This in turn allows the electron beam efficiently to pass through the aperture opening of the fixed aperture plate 61 when the acceleration voltage of the electron beam is varied.

The electron beam led from the electron source into the sample chamber is finely focused by the focusing electron optical system for irradiation onto the surface of the sample 8. Referring to FIG. 12, the focusing electron optical system comprises the final electrode 7, the first lens electrode 6, the second lens electrode 5, a cylindrical electrode 66, a deflecting space forming electrode 67, an insulating cylinder 68, a coil unit 69 and other related components. The focusing electron optical system made of these components are preset before being attached to the lower end of the beam column. A leading terminal 70 is provided penetratingly through the outer wall of the beam column. The leading terminal 70 is used to supply necessary voltages and currents to the lens electrodes and the coil unit assembled.

The beam column made of the electron source including the ion pump and of the focusing electron optical system is hermetically mounted on the upper wall of the sample chamber 24. Inside the sample chamber 24 are the secondary electron detector 15 for detecting secondary electrons emitted by the sample 8, a sample stage 71, and a sample stage fine-adjusting mechanism 72. The sample chamber 24 is constructed so that it may be evacuated by the vacuum pump 25 to at least $10^{-6}$ Torr in degree of vacuum.

When the focusing electron optical system is constructed using the above-mentioned electrostatic lens arrangement, the beam column as a whole is significantly reduced in size. Illustratively, the electron source section measures 34 mm in outer diameter, the ion pump section 80 mm in outer diameter, and the cylindrical electrode 66 of the focusing electron optical system 30 mm in outer diameter. The vacuum wall of the beam column illustratively measures 80 mm in maximum outer diameter, while the beam column is 130 mm in total length (i.e., height). The weight of the beam column is one hundredth or less of what the beam column of the comparable conventional structure generally weighs.

In the above-described focusing electron optical system, the final electrode 7 and cylindrical electrode 66 are both connected to ground potential. The first lens electrode 6 and second lens electrode 5 are supplied with DC voltages of about +5 to +6 kV. The first lens electrode 6 is electrically connected to the second lens electrode 5 via the cylinder-shaped deflecting space forming electrode 67. Therefore, the electrodes 5, 6 and 67 are all kept at the same potential. The insulating cylinder 68 is located outside the deflecting space forming electrode 67. On the outer circumference of the insulating cylinder 68 is the coil unit 69 around which the alignment coil for electron beam optical axis alignment, the stigma coil for astigmatism correction, and the deflecting coil for electron beam scanning are wound in an overlapping manner. The insulating cylinder 68 is preferably made of ceramic or like material that provides good electrical insulation and generates little gas.

In the setup above, the electron beam led from the beam column into the sample chamber is irradiated at the sample 8 after being focused by two kinds of electrostatic lens action. That is, the first electrostatic lens action is provided by the electric field formed between the opening of the upper surface center of the cylindrical electrode 66 and the central opening of the second lens electrode 5; the second electrostatic lens action is provided by the electric field produced between the first lens electrode 6 and the central opening of the final electrode 7. The electron beam of the acceleration voltage Va (usually 0.5 to 2 kV) is not only focused by a high electric field between the cylindrical electrode 66 and the second lens electrode 5; the beam is also accelerated thereby toward the second lens electrode 5. The electron beam is accelerated to maximum energy level when passing through the inner space of the deflecting space forming electrode 67. It is in that same inner space that the electron beam is deflected, optically aligned, and subjected to astigmatism correction.

The lens electric field formed between the first lens electrode 6 and the final electrode 7 works as an electrostatic objective lens. For example, when the acceleration voltage Va is set for 1 kV and the working distance WD between the lower surface of the final electrode 7 (the lowest electrode) and the surface of the sample 8 is set for 2 mm, the spot diameter (probe diameter) of the electron beam irradiated onto the sample surface is 5 to 6 nm. Thus it is possible to observe the sample with sufficiently high resolution at low acceleration voltages. The distance between the first lens electrode 6 and final electrode 7 is 2 mm.

The secondary electrons emitted by the sample 8 as a result of electron beam irradiation thereto are detected by the secondary electron detector 15. Since the final electrode 7, i.e., the lowest electrode, is connected to ground potential, the electrostatic objective lens is immune to disturbances emanating from the lens electric field. Thus the secondary electrons are efficiently detected.

One advantage of the fourth embodiment in FIG. 12 is that it provides a very small beam column construction while ensuring high levels of resolution for observation. Another advantage of the fourth embodiment is its high resistance to disturbances from external magnetic fields thanks to the fact that the electron beam passage inside the beam column is completely shielded by the magnetic material arrangement.

Figure 13:
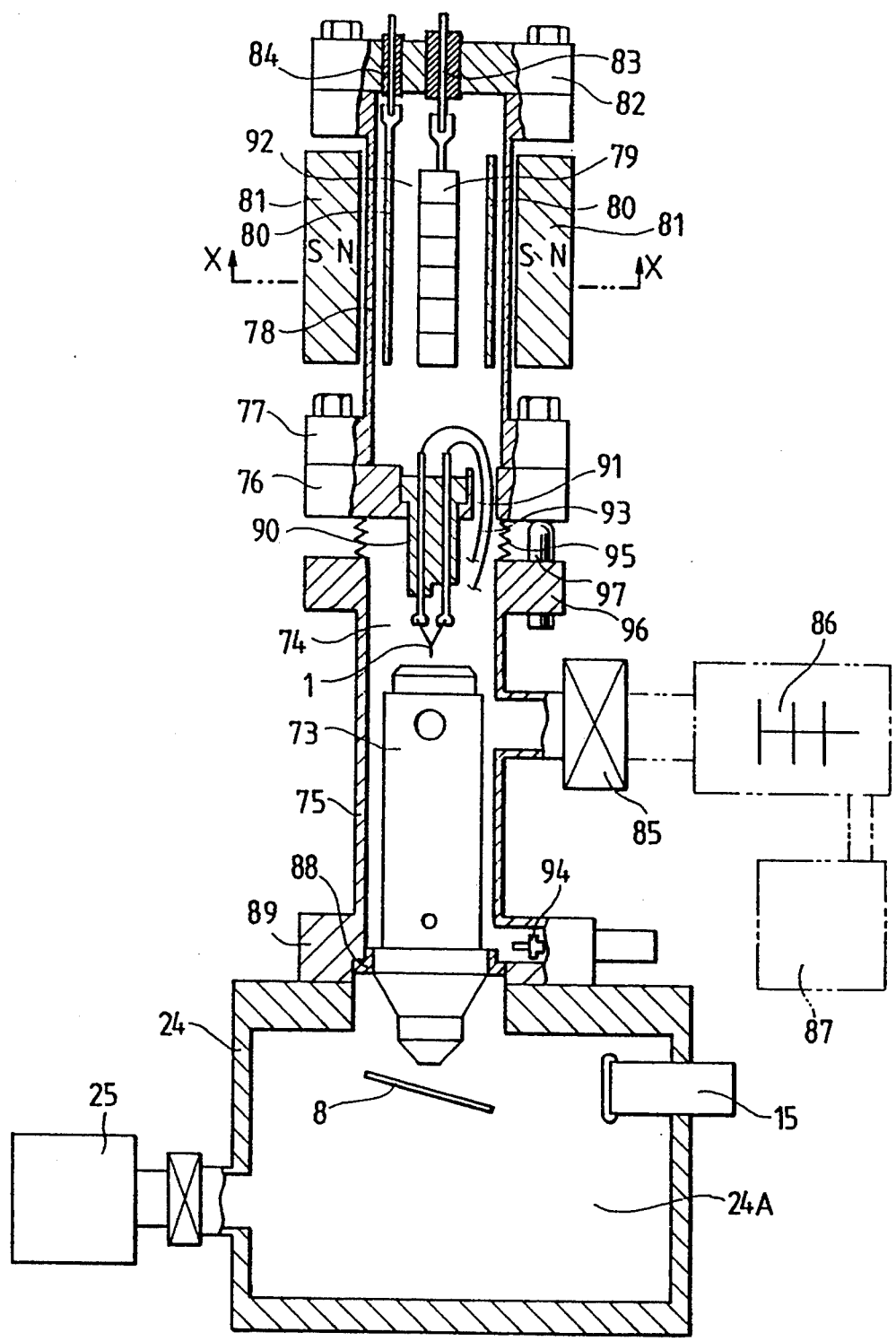
FIG. 13 is a schematic longitudinal section showing the basic construction of a scanning type electron microscope practiced as a fifth embodiment of the invention.

FIG. 13 depicts the fifth embodiment of the invention. The fifth embodiment is a significantly downsized scanning type electron microscope that incorporates a small vacuum pump in a beam column which is reduced in size using an electrostatic objective lens.

Referring to FIG. 13, an electron beam emitted by the field emission type electron source 1 is focused by a focusing optical system which is contained in a beam column 73 and which comprises the electrostatic objective lens. The focused electron beam is irradiated at the sample 8 while scanning the surface thereof two-dimensionally. Secondary electrons emitted by the sample 8 upon electron beam irradiation thereto are detected by the secondary electron detector 15. A detection signal from the detector 15 is converted to an image signal which in turn provides a two-dimensional secondary electron image of the sample 8.

An electron source chamber containing the field emission type electron source 1 is evacuated to a high degree of vacuum in the following setup: A vacuum vessel 75 containing the beam column 73 has an upper flange 76. A vacuum vessel 78 having the same diameter as that of the vacuum vessel 75 is connected to the top end of the upper flange 76. Inside the vacuum vessel 78 are electrodes 79 and 80 of an ion pump. Outside the vacuum vessel 78 are a pair of detachable magnets 81. The electrodes 79 and 80 are attached to current leading terminals 83 and 84 which is turn are mounted on an upper flange 82 of the vacuum vessel 78. This connects the electrodes 79 and 80 to an external power source, not shown, via the current leading terminals 83 and 84. A high vacuum valve 85 is connected to the side of the vacuum vessel 75 with a connecting pipe interposed therebetween. Further along the extension of the high vacuum valve 85, a turbo-molecular pump 86 and a roughing vacuum pump 87 are provided. The beam column 73 is attached to a lower flange 89 of the vacuum vessel 75 with a connecting member 88 therebetween. That is, the beam column 73 is connected via the flange 89 to the sample chamber 24. The inner space of the sample chamber 24 is evacuated by an independent vacuum pump 25. In terms of space, the sample chamber inner space 24A and an electron source chamber 74 are connected with each other through that very small opening of the beam column 73 through which the electron beam passes. But because the two chambers are evacuated by separate vacuum pumps and because the opening for the electron beam passage is very small and the resulting evacuation conductance very low, the two chambers may be sufficiently evacuated to different degrees of vacuum. That is, when the inner space of the sample chamber is at a low (or medium) degree of vacuum, the inner space of the electron source chamber 74 can be kept to a sufficiently high degree of vacuum.

A holder 90 made of an insulator for holding the electron source 1 is detachably mounted on the center of the upper flange 76 of the vacuum vessel 75. Off the center of the flange 76 are a plurality of through holes 91. Via the through holes 91, the electron source chamber 74 is spatially connected to a pump chamber 92. Lead wires 93 which flash the electron source 1 when energized are threaded through the through holes 91 and connected to a current leading terminal 94. In turn, the current leading terminal 91 is connected to an external power source, not shown. The flange 76 is connected via a bellows 95 to another flange 96 having adjusting screws 97. Turning the adjusting screws 97 to push up the flange 76 deforms the bellows 95 in such a manner as to move the flange 76 relative to the flange 96. In other words, it is possible, from outside the vacuum, to adjust optimally the position of the electron source 1 mounted on the flange 76 relative to the electrostatic lens arrangement inside the beam column 73.

What follows is a description of the steps to evacuate the electron source chamber 74. In operation, the valve 85 is first opened to operate the roughing vacuum pump 87 and turbo-molecular pump 86. This evacuates the electron source chamber 74 and the pump chamber 92. At the same time, the vacuum pump 25 is also turned on to evacuate the sample chamber inner space 24A. Then the magnets 81 are detached and a heater is installed outside the vacuum vessels 75 and 78 to bake the vacuum vessel walls. The baking is usually conducted at 200° C. to 300° C. The gases generated from the baking process are evacuated by the turbo-molecular pump 86. After thorough degassing following the baking process, the vacuum vessel walls are allowed to return to room temperature. This brings the pressure inside the electron source chamber 94 to about $10^{-10}$ Torr in degree of vacuum. Again the magnets 81 are replaced outside the pump chamber 92, the negative electrode 80 is connected to the same ground potential as that of the vacuum vessel walls, and a positive high voltage is supplied to the positive electrode 79. This causes the pump chamber 92 to act as an ion pump, evacuating the electron source chamber 74 through the through holes 91. The evacuation by the ion pump brings the pressure inside the electron source chamber to as high as $10^{-10}$ to $10^{-11}$ Torr in degree of vacuum. At this point, the high vacuum valve 85 is closed so as to disconnect the turbo-molecular pump 86. This leaves only the ion pump operational for evacuation. Since the inside of the vacuum vessel has been sufficiently degassed, the ion pump operating singly can maintain the high vacuum state of $10^{-10}$ to $10^{-11}$ Torr. Then with the high vacuum valve 85 still closed, the turbo-molecular pump 86 and roughing vacuum pump 87 are removed. When the high vacuum state is realized in this manner within the electron source chamber 74, the electron source 1 is momentarily energized for flashing. Thereafter, a predetermined extraction voltage is applied between the electron source 1 and the extraction electrode inside the beam column 73 so as to extract the electron beam from the electron source 1. At the same time, a predetermined voltage is fed to each of the lens electrodes inside the beam column 73 to activate the electrostatic lens arrangement. The adjusting screws 97 are also manipulated optimally to position the electron source 1. The scanning type electron microscope is now ready to function.

The steps described above cover both the evacuation procedure and the preparations for the scanning type electron microscope to operate. After the electron microscope has started functioning and various attachments have been removed, the construction thereof is found to be very compact. That is, above the sample chamber 24 are only two components: the vacuum vessel 75 containing the beam column 73, and the vacuum vessel 75 containing the beam column 73, and the vacuum vessel 78 which is about the same in size as the vessel 75 and which comprises the ion pump. As described, the combination of the field emission type electron source with the electrostatic objective lens significantly downsizes the beam column of the scanning type electron microscope.

As in the second embodiment of FIG. 7, combining that scanning type electron microscope with the ion pump of the fifth embodiment considerably reduces in size the microscope portion above the sample chamber 24. For example, when the vacuum vessels 75 and 78 measure 34 mm in outer diameter each and the upper flange 82 is an ICF standard cone flat flange measuring 70 mm in diameter, the microscope portion above the sample chamber can measure only 200 to 250 mm in height. This means that the scanning type electron microscope of the fifth embodiment together with its vacuum pumps may be as small as one hundredth or less in terms of volume of the conventional scanning type electron microscope of the comparable capacity. Thus one significant advantage of the fifth embodiment is that the entire electron microscope including the vacuum pumps can be made very small in size. Another advantage of the fifth embodiment is that because the pump chamber 92 is completely detached from the electron source chamber 74 by the flange 77, both the pump chamber and the electron source chamber are very easy to maintain.

Figure 14:
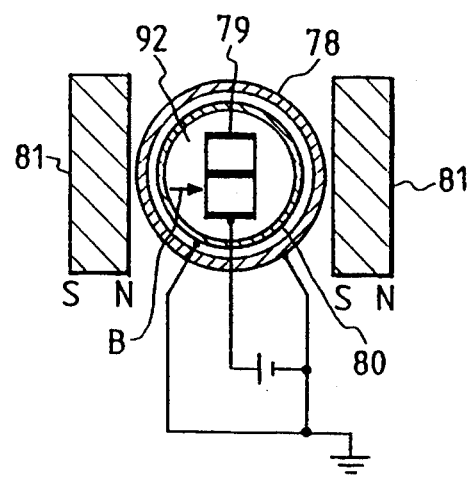
FIG. 14 is a schematic cross section taken on line X—X of FIG. 13.

FIG. 14 is a cross section of the pump chamber 92 shown in FIG. 13, taken along line A—A. The negative electrode 80 is a thin-walled cylindrical body made of titanium (Ti) and connected to the same ground potential as that of the vacuum vessel 78. Inside the negative electrode 80 is the positive electrode 79 constituted by a large number of stainless steel cylindrical cells. The axial direction of each of the cells coincides with the orientation of the magnetic field B formed by the pair of magnets 81.

Applying a high voltage to the positive electrode 79 generates electrons inside the negative electrode 80. These electrons are moved by the magnetic field B over long distances in spiral fashion within each cell of the positive electrode 79. During their movement, the electrons collide with gas molecules, producing ions and secondary electrons. The secondary electrons thus generated are also moved by the magnetic field B in spiral fashion within the positive electrode cells. During their spiral movement, the secondary electrons reciprocate between the opposing negative electrode surfaces; they travel over very long distances before finally reaching the positive electrode.

When traveling in this manner, the secondary electrons collide with and ionize incoming gas molecules. The ions thus generated are immediately attracted to and impact against the negative electrode 80. This produces titanium atoms from a negative electrode surface through sputtering. The sputtered titanium atoms stick to the surface of the cells of the positive electrode 79 or to another surface of the negative electrode 80, forming a pure titanium film thereon. This titanium film chemically traps gas molecules that may come close (this action is called getter action). Thus the ion pump function for high degree evacuation is implemented by two kinds of action, one action involving the negative electrode surface capturing gas molecules that are ionized upon collision with electrons, the other action involving the formation of a titanium film by sputtered titanium atoms to chemically trap gas molecules (getter action).

The construction of FIG. 14 may be made more effective by providing a plurality of slits on the cylindrical wall of the negative electrode 80. Part of the titanium atoms sputtered by impacting ions pass through these slits and adhere to the inner wall of the vacuum vessel 78 outside the negative electrode 80. An additional getter action takes place on the inner wall of the vacuum vessel 78. In this manner, the evacuation capability of the ion pump is reinforced when the getter action on the surface of the negative electrode 80 is supplemented by that on the surface of the vacuum vessel 78.

Figure 15:
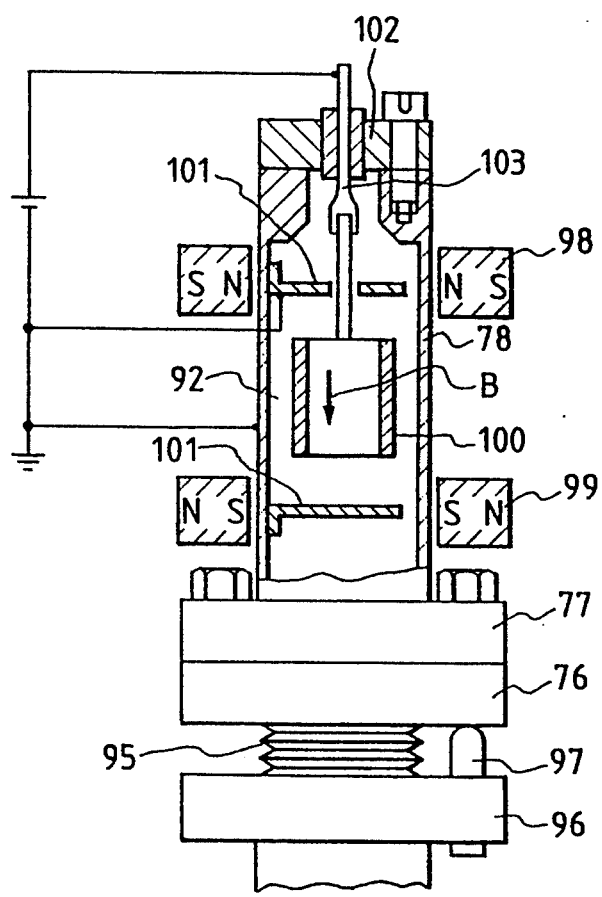
FIG. 15 is a partial schematic longitudinal section showing the basic construction of a pump arrangement in a scanning type electron microscope practiced as a sixth embodiment of the invention.

FIG. 15 is a partial schematic longitudinal section showing a pump arrangement in the sixth embodiment of the invention. In the pump chamber 92, a cylindrical positive electrode 100 is located so that its axial direction coincides with that of the vacuum vessel 78. Above and below the positive electrode 100 are a pair of disc-shaped titanium electrodes (negative) 101. The vacuum vessel 78 is sandwiched from above and below by a pair of ring-shaped, radially magnetized magnets 98 and 99. A magnetic field B is generated in the axial direction of the positive electrode 100 by having the upper and lower magnets 98 and 99 opposed to each other in terms of magnetized direction. The positive electrode 100, connected to a current leading terminal 103 mounted on an upper flange 102, is suspended within the inner space of the pump chamber 92.

In the setup above, the titanium electrode (negative) 101 is connected to the same ground potential as that of the vacuum vessel 78, and a high positive voltage is supplied to the positive electrode 100. This evacuates the pump chamber interior by the same operating principle as described in connection with FIG. 14. That is, evacuation is performed by two kinds of getter action: one action involving residual gas molecules becoming ionized and captured on the surface of the negative electrode 100, the other action involving the formation of a titanium film on the inner walls of the positive electrode 100 and vacuum vessel 78 by the sputtered titanium atoms sticking thereto.

Figure 16:
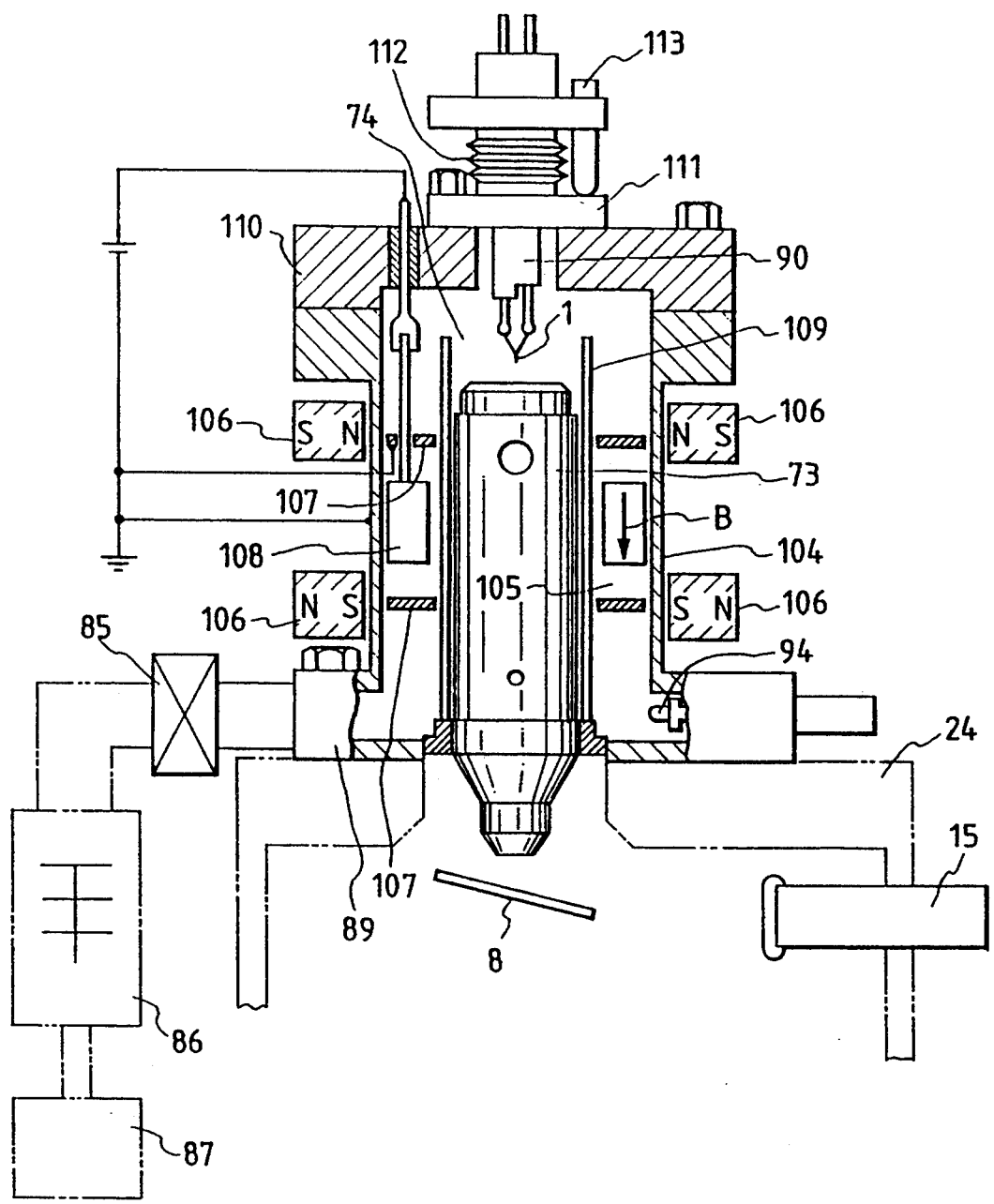
FIG. 16 is a schematic longitudinal section depicting the basic construction of a pump arrangement in a scanning type electron microscope practiced as a seventh embodiment of the invention.

FIG. 16 is a schematic longitudinal section of a pump arrangement in the seventh embodiment of the invention. In this embodiment, a pump chamber 105 is provided on the outer circumference of the beam column 73 inside a cylindrical vacuum vessel 104. The pump chamber 105 comprises electrodes and other related components that constitute an ion pump. Outside the vacuum vessel 104 are a pair of permanent magnets 106 vertically opposed to each other.

By the same operating principle as in FIG. 15, the vertically oriented magnetic field B is generated inside the pump chamber 105. The pump chamber 105 comprises a pair of donut-shaped disc type titanium electrodes 107 vertically opposed to each other. Between the upper and lower titanium electrodes are a plurality of circumferentially arranged cylindrical positive electrodes 108 which are axially aligned with the magnetic field B. The titanium electrodes 107 are connected to the same ground potential as that of the wall of the vacuum vessel 104, and a high positive voltage is fed to the positive electrodes 108. This triggers an ion pump evacuation process based on the same operating principle as described in connection with FIG. 15.

Outside the beam column 73 is a magnetic shield 109 made of a cylindrically shaped alloy member of high magnetic permeability (e.g., permalloy). The magnetic shield 109 also prevents the titanium atoms sputtered from the negative electrodes 107 from coming into the beam column 73. The evacuation steps are the same as those described in connection with FIG. 13. That is, the turbo-molecular pump 86 is operated for evacuation while the entire apparatus is being baked.

After baking, an ion pump process is triggered by applying a voltage to the positive electrodes 108. This brings the inner space of the pump chamber 105 and that of the electron source chamber 74 to as high as $10^{-10}$ to $10^{-11}$ Torr in degree of vacuum. In that state, the valve 85 may be closed so as to disconnect completely the low vacuum pump system comprising the turbo-molecular pump 86.

A flange 111 supporting the electron source 1 is positioned at the center of a flange 110 above the electron source 74. Adjusting screws 113 may be used to deform a bellows 112 in such a manner that the electron source 1 may be optimally positioned relative to the extraction electrode and electrostatic lens arrangement within the beam column 73. In this manner, the seventh embodiment also downsizes considerably the entire construction of the scanning type electron microscope along with its evacuation system.

Figure 17:
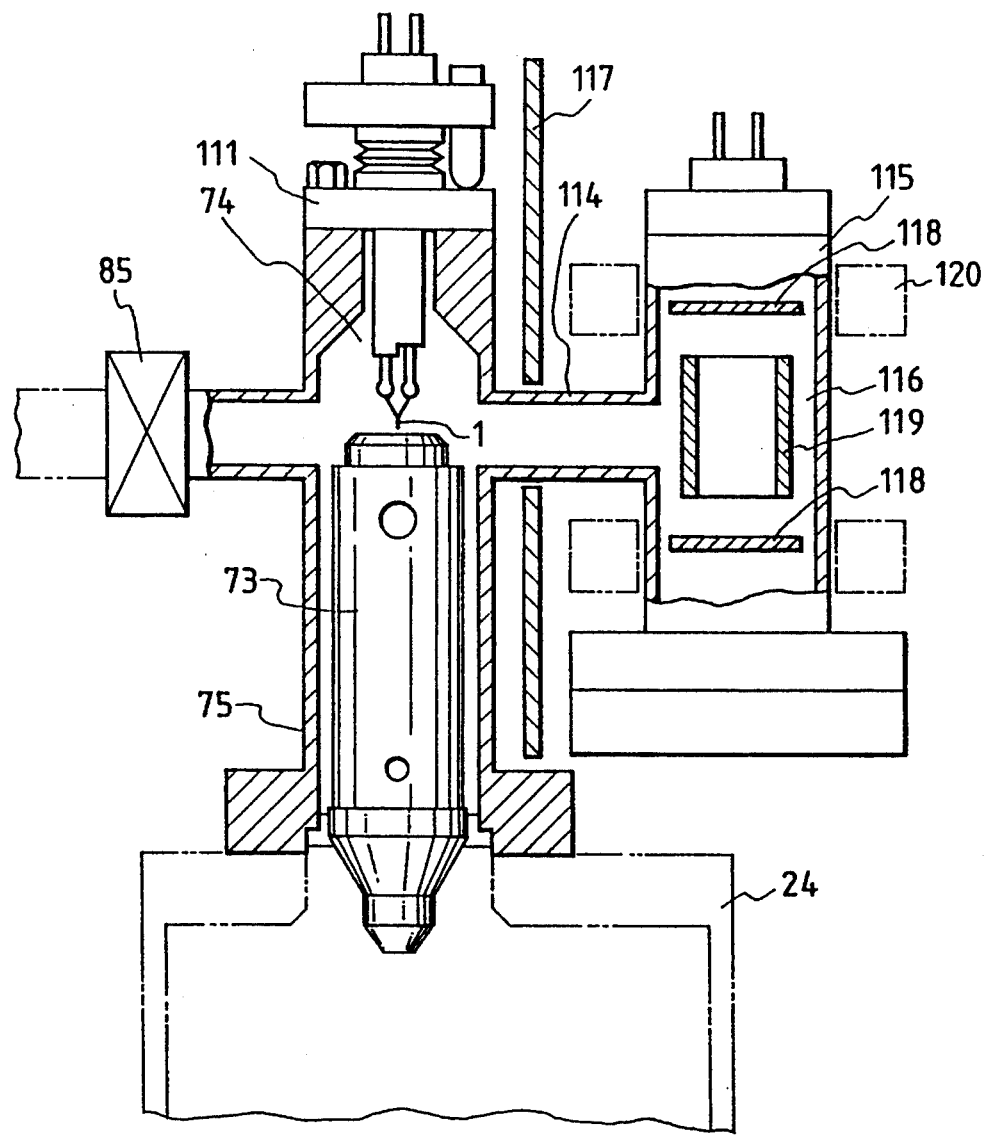
FIG. 17 is a schematic longitudinal section showing the basic construction of a pump arrangement in a scanning type electron microscope practiced as an eighth embodiment of the invention.

FIG. 17 illustrates the eight embodiment of the invention. In this embodiment, a cylindrical vacuum vessel 115 constituting a pump chamber 116 is provided alongside the vacuum vessel 75 containing the beam column 73. The two vacuum vessels 75 and 115 are connected by a connecting pipe 111 located on the side of the electron source 1. The locations and functions of electrodes 118, 119, magnets 120 and other related components provided inside the pump chamber 116 and constituting an ion pump therein are the same as those of their counterparts in the sixth embodiment of FIG. 15. A magnetic shield 117 may be provided to shield the beam column 73 and electron source chamber 94 from the magnetic field of the magnets 120.

The eight embodiment is also effective in reducing the size of the entire construction of the scanning type electron microscope along with its vacuum pump system. Another advantage of the eighth embodiment is that it allows the pump chamber 116 and the electron source chamber 74 to be maintained independently of each other.

Although the vacuum vessel 75 is axially aligned with the vacuum vessel 115 in the eighth embodiment, the vacuum vessel 115 may be alternatively located so as to be axially perpendicular to that of the vacuum vessel 75. The eighth embodiment may also be modified by installing a vacuum valve and a flange connecting part halfway along the connecting pipe 114. In this modification, the vacuum valve may be used hermetically to disconnect the pump chamber 116 from the electron source chamber 74; the flange connecting part may be used completely to disconnect the pump 116 from the electron source chamber 74. This will make it easier to assemble or maintain the apparatus.

As described and according to the invention, there is provided a charged particle beam apparatus having a beam column downsized by use of a field emission type electron source and an electrostatic objective lens, the downsized beam column being contained in a vacuum vessel comprising a small vacuum pump for high degree evacuation. This makes the entire construction of the charged particle beam apparatus along with its vacuum pump system considerably smaller in size than the prior art apparatus of comparable capacity.

While preferred embodiments of the invention have been described using specific terms, such description is for illustrative purposes only, and it is to be understood that changes and variations may be made without departing from the spirit and scope of the appended claims. For example, although the invention has been described principally in connection with the scanning type electron microscope, it also applies to electron beam measuring instruments, Auger electron analyzers, electron beam lithography apparatus, electron beam testers and other devices that utilize the focused electron beam. Furthermore, simple modifications such as the switching of polarities of supply voltages will readily apply the invention to ion microscopes, focused ion beam apparatus, secondary ion mass spectrometers and other devices that employ the focused ion beam. That is, the present invention may be applied to all kinds of charged particle beam apparatus using the focused charged particle beam.

What is claimed is:

1. A charged particle beam apparatus comprising:
    a sample chamber having an inner space for accommodating a sample therein;
    a beam column having an inner space and containing at least a charged particle beam generating section for generating a charged particle beam for irradiation onto said sample;
    a first vacuum pump system for evacuating the inner space of said sample chamber;
    valve means provided between said beam column and said sample chamber for vacuum sealing the inner space of said beam column from the inner space of said sample chamber; and
    means for moving said beam column relative to said sample chamber for separating said beam column from said sample chamber.

2. A charged particle beam apparatus according to claim 1, further comprising:
    a second vacuum pump system for evacuating the inner space of said charged particle beam generating section.

3. A charged particle beam apparatus according to claim 1, wherein said beam column further comprises a focusing lens system for focusing onto said sample said charged particle beam coming from said charged particle beam generating section.

4. A charged particle beam apparatus according to claim 1, wherein said charged particle beam generating section includes a field emission-type electron source as the charged particle beam source for generating said charged particle beam.

5. A charged particle beam apparatus according to claim 3, wherein said focusing lens system is entirely constituted by an electrostatic lens.

6. A charged particle beam apparatus according to claim 5, wherein said electrostatic lens includes a plurality of lens electrodes,
    one of said lens electrodes being a final electrode located closest to said sample;
    all of said lens electrodes except for said final electrode being supplied with positive voltages relative to said final electrode when said charged particle beam is negatively charged; and
    all of said lens electrodes except for said final electrode being supplied with negative voltages relative to said final electrode when said charged particle beam is positively charged.

7. A charged particle beam apparatus according to claim 6, wherein said charged particle beam generating section includes a field emission-type electron source as the charged particle beam source for generating said charged particle beam.

8. A charged particle beam apparatus, comprising:
    a sample chamber having an inner space for accommodating a sample therein;
    a beam column having an inner space and containing at least a charged particle beam generating section for generating a charged particle beam for irradiation onto said sample;
    a first vacuum pump system for directly evacuating the inner space of said sample chamber; and
    a second vacuum pump system for directly evacuating the inner space of said charged particle beam generating section;

wherein said second vacuum pump system is contained within the inner space of said beam column;

wherein the inner space of said charged particle beam generating section is also evacuated by said first vacuum pump system only through an evacuation path formed by the inner space of said sample chamber and the inner space of said beam column; and wherein said charged particle beam apparatus further comprises means for moving said beam column relative to said sample chamber for separating said beam column from said sample chamber.

9. A charged particle beam apparatus, comprising:

a sample chamber having an inner space for accommodating a sample therein;

a beam column having an inner space and containing at least a charged particle beam generating section for generating a charged particle beam for irradiation onto said sample; and a first vacuum pump system for directly evacuating the inner space of said sample chamber;

wherein the inner space of said charged particle beam generating section is further indirectly evacuated by said first vacuum pump system only through an evacuation path formed by the inner space of said sample chamber and the inner space of said beam column; and wherein said charged particle beam apparatus further comprises means for moving said beam column relative to said sample chamber for separating said beam column from said sample chamber.

* * * * *